United States Patent

Scoones et al.

[11] Patent Number: 5,892,450
[45] Date of Patent: Apr. 6, 1999

[54] CIRCUIT ARRANGEMENT FOR TESTING THE OPERATION OF A CURRENT MONITORING CIRCUIT FOR A POWER TRANSISTOR

[75] Inventors: Kevin Scoones, München; Erich Bayer, Piflas, both of Germany

[73] Assignee: Texas Instruments Incorported, Dallas, Tex.

[21] Appl. No.: 685,889

[22] Filed: Jul. 25, 1996

[30] Foreign Application Priority Data

Jul. 27, 1995 [DE] Germany .................. 195 27 487.3

[51] Int. Cl.$^6$ .................................................. G08B 21/00
[52] U.S. Cl. .................... 340/664; 340/661; 340/662; 324/537
[58] Field of Search .................. 340/664, 662, 340/661, 653; 361/87; 324/537, 500, 765, 766, 768, 767, 769

[56] References Cited

U.S. PATENT DOCUMENTS

| | | | |
|---|---|---|---|
| 3,702,469 | 11/1972 | Golja | 340/662 |
| 4,538,198 | 8/1985 | Imanishi et al. | 361/87 |
| 5,559,500 | 9/1996 | Kase | 340/664 |

*Primary Examiner*—Jeffery A. Hofsass
*Assistant Examiner*—Anh La
*Attorney, Agent, or Firm*—William B. Kempler; Richard L. Donaldson

[57] ABSTRACT

The invention relates to a circuit arrangement for testing the operation of a current monitoring circuit for a power transistor. The power transistor consists of several single transistors of the same size connected in parallel, through which a fraction of the total current supplied to the power transistor flows. A monitoring signal proportional to the current flowing through one of the single transistors, is supplied to the current monitoring circuit, which generates an alarm signal when this monitoring signal exceeds a specified threshold value. The single transistors are divided into a group containing a small number of single transistors ($T_{1,1}$–$T_{1,9}$) connected in parallel and a group with a larger number of single transistors ($T_{2,1,1}$–$T_{2,2,9}$) connected in parallel, which can be driven independently of each other, where the single transistor ($T_S$) supplying the monitoring signal belongs to the smaller group. A control circuit (ST) is provided, which, in one monitoring mode, in which only a current that is reduced in relation to the number of single transistors in the two groups, is supplied to the power transistor ($T_S$, $T_1$, $T_2$), puts the larger group of single transistors into the off-state.

4 Claims, 2 Drawing Sheets

CIRCUIT ARRANGEMENT FOR TESTING THE OPERATION OF A CURRENT MONITORING CIRCUIT FOR A POWER TRANSISTOR

BACKGROUND OF THE INVENTION

This invention relates to a circuit arrangement for testing the operation of a current monitoring circuit for a power transistor, which consists of several single transistors connected in parallel, through which a fraction of the total current supplied to the power transistor flows, where a monitoring signal proportional to the current flowing through one of the single transistors, is supplied to the current monitoring circuit, which generates an alarm signal when this signal exceeds a specified threshold value.

Texas Instruments Incorporated have already produced and marketed an integrated circuit of the above type under the type designation TRICO1O6, in which a power transistor is present, which controls a current flowing through a motor. In order to monitor the current flowing through the motor, a current monitoring circuit is used, which contains a comparator, which always emits a monitoring signal when the current flowing through the power transistor and thus also through the motor, exceeds a predetermined value. It was only possible to monitor this integrated circuit, in particular the current monitoring function, in this circuit after completion and in practical operation with the high currents actually flowing through the motor. However, when producing integrated semi-conductor circuits, it is desirable to check the operation of at least parts of the circuit, at the earliest possible stage of production, preferably even before bonding and contacting. For these checking processes, test probes are used which are/applied to the bond contact surfaces, which are to be contacted at a later stage, of the integrated semiconductor circuit and through which the currents and control signals are supplied during test running. Checking the current monitoring circuit of the power transistor in the case of the known circuit described, is, however, not possible with test probes, because with test probes, currents of more than 1 A cannot be supplied because of the small contact surfaces.

SUMMARY OF THE INVENTION

The invention therefore has the task of creating a circuit arrangement of the type indicated at the outset, which enables the operation of a current monitoring circuit for a power transistor, to be checked in the integrated semiconductor circuit even before it is bonded and contacted.

The circuit arrangement of the type described at the outset for solving this problem is characterised in that the single transistors are divided into a group having a small number of single transistors connected in parallel and a group having a larger number of single transistors connected in parallel, which can be driven independently of each other, where the single transistor supplying the monitoring signal belongs to the smaller group and that a control circuit is provided, which, in one checking mode, in which only a current that is reduced in relation to the number of single transistors in the two groups, is supplied to the power transistor, puts the larger group of single transistors into the off-state.

When using the features of the circuit arrangement according to the invention, exactly the same current flows through the current monitoring circuit, in one checking mode, as in normal operation of the finished circuit, so that with regard to the checking mode and normal operation, there is no difference in the behaviour of the monitoring circuit. This is achieved, although in the checking mode, a considerably smaller current is sent through the power transistor, so that the usual test probes and the available test facilities can be used for checking.

Beneficial further developments of the invention are identified in the sub-claims.

BRIEF DESCRIPTION OF THE DRAWINGS

A practical example of the invention is explained in greater detail with reference to the drawing. In the drawing.

DETAILED DESCRIPTION OF THE PREFERRED EMBODIMENT

The circuit arrangement shown in FIG. 1 contains a power transistor, which, as will be explained in more detail below, is made up in practice of many individual, single transistors connected in parallel, but which, for the purpose of explanation, only consists of three single transistors $T_1$, $T_2$ and $T_S$ here. The active surface of the transistor $T_2$ is many times larger than that of the transistor $T_1$, the active surface of which is again many times larger than the active surface of the transistor $T_S$.

Figure 1:
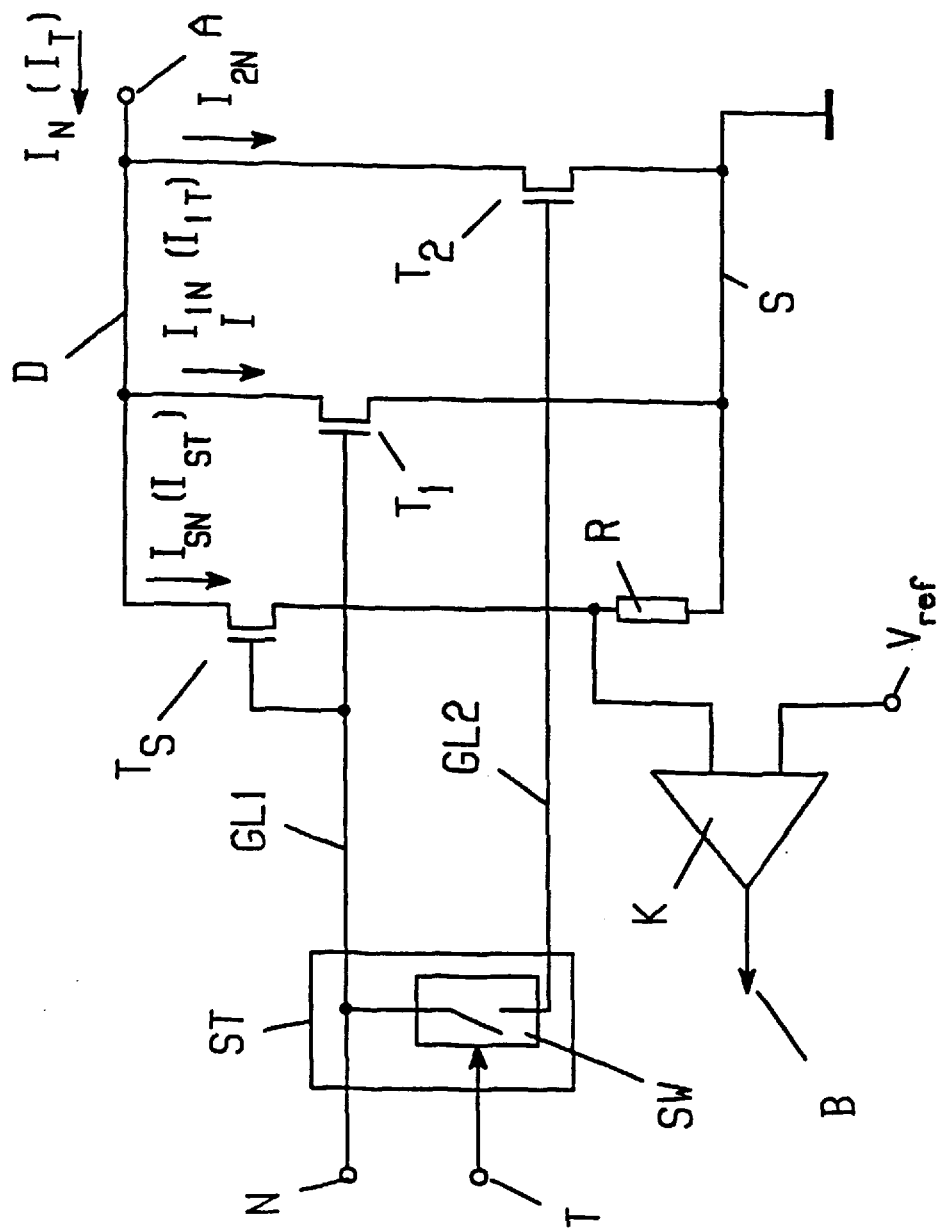
FIG. 1 shows a simplified circuit diagram of a circuit arrangement according to a preferred form of execution of the invention and FIG. 2 shows a circuit diagram of the circuit arrangement of FIG. 1 with a detailed illustration of the power transistor.

As can be seen, the circuit arrangement of FIG. 1 also contains a control circuit ST, which has an input N and an input T. With the help of a switch in the control circuit ST, which can be switched between a closed and an open state by means of a signal at the input T, it is possible to supply the control signal supplied to the input N of the control circuit via the line GL1 only to the gate terminals of the transistors $T_S$ and $T_1$ (open state of the switch SW) or, in addition, via the line GL2, to the gate terminals of all three transistors $T_S$, $T_1$ and $T_2$ jointly (closed state of the switch SW).

With the help of the circuit arrangements, for example, the current I flowing through a consumer not shown in the drawing and connected to the terminal A can be switched on or off using the signal supplied to the input N of the control circuit ST. The switch SW is merely used to perform an operating mode which will be described in greater detail below.

As can be seen, a resistance $R_S$ is inserted in the source line of the transistor $T_S$ and connected to the junction of the source terminal of the transistor $T_S$ and the resistance $R_S$ is one input of a comparator K, which at its other input receives a reference voltage $V_{ref}$. In this circuit arrangement the comparator always emits an alarm signal at its output B when the drop in voltage at the resistance $R_S$ exceeds the reference voltage $V_{ref}$, which at the same time means that the current which flows through the transistor $T_S$ and the resistance $R_S$ is above a predetermined threshold value.

As already mentioned, in normal operation the switch SW in the control circuit ST is closed as a result of a corresponding signal at the input T, so that the three transistors $T_S$, $T_1$ and $T_2$ are connected in parallel. If a signal is now applied to input N of the control circuit ST, which connects the three transistors, then the current $I_N$ can flow through the consumer (not illustrated), connected to the terminal A, via the transistors to ground. The major part of the consumer current, i.e. the currents $I_{1N}$ and $I_{2N}$, flows through the two transistors $T_1$ and $T_2$, whilst only a fraction $I_{SN}$ of this current flows through the transistor $T_S$, because its active surface is significantly smaller than the active surfaces of the other two transistors $T_1$ and $T_2$. The transistor $T_S$ acts purely as a current sensor, which causes the comparator K to emit the alarm signal when the current $I_{SN}$ flowing through it, exceeds a predetermined threshold value. As the current through the transistor $T_S$ is always proportional to the current through the other two transistors because the transistors are connected in parallel, it is possible to derive a statement from the current flowing through it regarding the total current through the power transistor.

When producing the circuit arrangement described as a constituent part of an integrated semiconductor circuit, it is desirable for a check to be made at the earliest possible stage of manufacture to see whether the current monitoring circuit, which is made up of the transistor $T_S$, the resistance $R_S$ and the comparator K, actually does emit the alarm signal at the desired threshold value of the current which flows through the transistor $T_S$ and the resistance $R_S$. If the integrated circuit is not bonded and contacted, the checking can only carried with the help of test probes which are placed on the bonded surfaces of the integrated circuit in order to supply the corresponding currents and voltages. The currents supplied must be limited to values below 1 A, since larger currents would lead to malfunctions in the test probes and/or the bond contact surfaces. The circuit arrangement illustrated in FIG. 1 makes it possible to test the operation of the current monitoring circuit, even when the current supplied to the terminal A is significantly smaller than the current which flows through the power transistor when the circuit arrangement is operating normally.

In order to perform the checking process the switch SW is set in the open state with the help of a control signal at the input T of the control circuit ST. This causes the transistor $T_2$ to become non-conducting, so that no more current can flow through it. Let it now be assumed that the active surfaces of the transistors $T_2$, $T_1$ and $T_S$ are in the ratio 90:9:1. If the current supplied via test probes to the terminal A is now reduced in the ratio of the sum of all the active surfaces to the sum of the active surfaces of the transistors $T_S$ and $T_1$, i.e. the following applies in general terms:

$$\frac{F_S + F_1 + F_2}{F_S + F_1} = \frac{I_N}{I_T}$$

where $F_S$: active surface of the transistor $T_S$
$F_1$: active surface of the transistor $T_1$
$F_2$: active surface of the transistor $T_2$
$I_N$: current flowing in normal operation
$I_T$: current flowing during check operation then the current $I_{ST}$ flowing through the transistor $T_S$ acting as current sensor is just as large as the current $I_{SN}$ that flows in normal operation. The current $I_{1N}$ or $I_{1S}$ flowing through the transistor $T_1$ is also the same in both operating modes.

By making a slight change in the current supplied to the terminal A it is now possible to test whether the alarm signal is emitted at the output B of the comparator K, when the current through the transistor $T_S$ exceeds the specified threshold value or is not emitted if the threshold value is not reached.

In checking mode, part of the power transistor is also active, which is represented in FIG. 1 by the transistor $T_1$, which increases the accuracy of the check on the comparator because influences attributable to the power transistor are included in the checking process. A precise explanation of these influences is given in conjunction with the description of FIG. 2.

Figure 2:
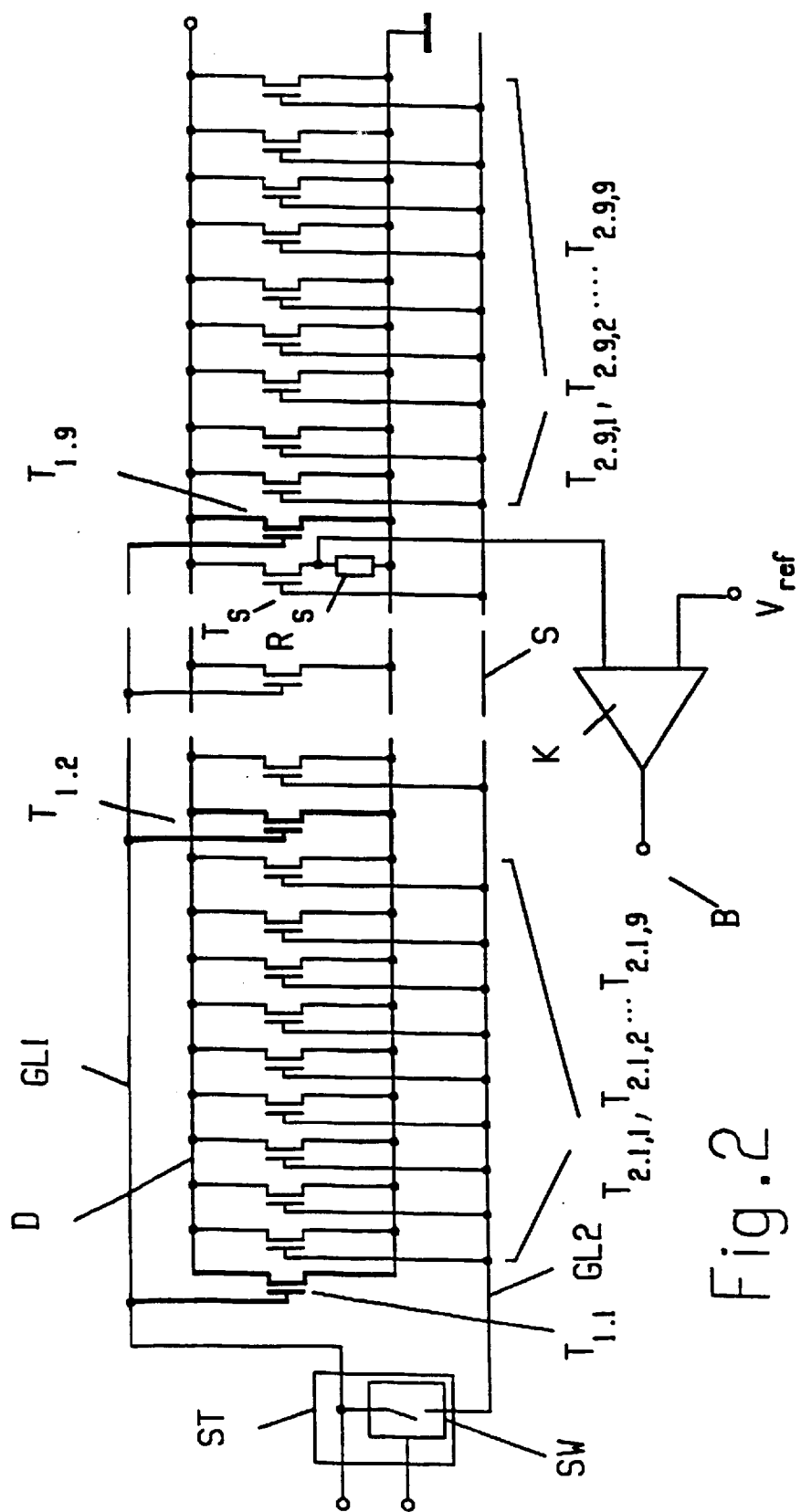

It can be seen in FIG. 2 that the power transistor is made up of a large number of equal-sized single transistors $T_S$, $T_{1,1}$ to $T_{1,9}$ and $T_{2,1,1}$ to $T_{2,9,9}$, the source and drain terminals of which are connected respectively to a common source line S and a common drain line D. The gate terminals of the first group of single transistors $T_{1,1}$ to $T_{1,9}$ which are shown by the thick line in FIG. 2, are connected to a common gate line GL1 and the gate terminals of a second group of single transistors $T_{2,1,1}$ to $T_{2,9,9}$ are connected to a common gate line GL2. The corresponding lines can also be recognized in FIG. 1.

The power transistor made up in practice, for example, of 100 single transistors with equal active surfaces, can be divided in such a way, that 90 single transistors are connected in parallel thus forming the transistor marked $T_2$ in FIG. 1, whilst 10 single transistors are connected in parallel to form a group, of which 9 form the transistor $T_1$ of FIG. 1, whilst the 10th single transistor forms the current sensor transistor $T_S$.

FIG. 2 illustrates in diagrammatic form that the single transistors $T_{1,1}$ to $T_{1,9}$ forming the smaller group, consist if possible, of transistors which are evenly distributed over the surface of the semi-conductor substrate, on which the power transistor is formed. In this way, scattering, which may occur both in respect of the doping of the active zones of the single transistors and in respect of the geometrical size of these single transistors, is best compensated for.

If, in a concrete case it is assumed that in normal operation a current $I_N$ of 10 A is to flow through the power transistor, then the same fraction of this current flows through each of the single transistors, i.e. a current $I_T$ of 100 mA. The comparator K then receives such a reference voltage $V_{ref}$, that it always emits the alarm signal when a current $I_{ST}$ flows through the transistor $T_S$, which exceeds the value of 100 mA. If the comparator K is to be checked then, as was described in connection with FIG. 1, the larger group G2 of single transistors is rendered non-conductive with the help of the control circuit ST and a current of only 1 A is supplied by way of test probes, which then splits in such a way that a current of 100 mA in each case, flows through the transistors which are still conductive in this checking mode. In this way, it is possible to check the response of the comparator K at the same current value $I_{ST}$ as during normal operation, although only the current reduced to 1 A has to be supplied via the test probes of the circuit being tested, which presents no problems with the test probes.

The circuit arrangement described does contain a power transistor made up of many single DMOS field effect transistors, but it can also be produced with other types of transistors.

We claim:

1. Circuit arrangement for testing the operation of a current monitoring circuit for a power transistor, which consists of several single transistors connected in parallel, through which a fraction of the total current supplied to the power transistor flows, where a monitoring signal proportional to the current flowing through one of the single transistors, is supplied to the current monitoring circuit, which generates an alarm signal when this monitoring signal exceeds a specified threshold value, characterised in that the single transistors are divided into a group containing a small number of single transistors ($T_{1,1}$–$T_{1,9}$) connected in parallel and a group with a larger number of single transistors ($T_{2,1,1}$–$T_{2,9,9}$) connected in parallel, which can be driven independently of each other, where the single transistor ($T_S$) supplying the monitoring signal belongs to the smaller group, and that a control circuit (ST) is provided, which, in one monitoring mode, in which only a current ($I_T$) that is reduced in relation to the number of single transistors in the two groups, is supplied to the power transistor ($T_S$, $T_1$, $T_2$), puts the larger group of single transistors into the off-state.

2. Circuit arrangement according to claim 1, characterised in that single transistors of the power transistor are formed on a surface of a semi-conductor substrate and that the single transistors of both groups are regularly distributed over the surface, on which the power transistor is formed.

3. Circuit arrangement according to claim 1, characterised in that the current monitoring circuit contains a comparator (K), which at one input receives the monitoring signal that is proportional to the current flowing through one of the single transistors, and receives at a second input, a reference signal ($V_{ref}$), where the alarm signal is generated by comparing the monitoring signal with the reference signal.

4. Circuit arrangement according to claim 1, characterised in that a resistance ($R_S$) is inserted in a live lead of the single transistor used to generate the monitoring signal, and that the monitoring signal is the voltage drop at this resistance.

* * * * *